US009025355B2

(12) United States Patent
De Santis et al.

(10) Patent No.: US 9,025,355 B2
(45) Date of Patent: May 5, 2015

(54) NON-VOLATILE MEMORY DEVICE WITH CLUSTERED MEMORY CELLS

(71) Applicants: STMicroelectronics S.r.l., Agrate Brianza (IT); STMicroelectronics PVT Ltd, Greater Noida (IN)

(72) Inventors: Fabio De Santis, Milan (IT); Marco Pasotti, Travaco' Siccomario (IT); Abhishek Lal, Faridabad (IN)

(73) Assignees: STMicroelectronics S.r.l., Agrate Brianza (MB) (IT); STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/954,908

(22) Filed: Jul. 30, 2013

(65) Prior Publication Data
US 2014/0036564 A1    Feb. 6, 2014

(30) Foreign Application Priority Data

Jul. 31, 2012   (IT) .............................. TO2012A0682

(51) Int. Cl.
| | | |
|---|---|---|
| G11C 5/06 | (2006.01) | |
| G11C 5/02 | (2006.01) | |
| G11C 7/18 | (2006.01) | |
| G11C 8/12 | (2006.01) | |
| G11C 16/00 | (2006.01) | |
| G11C 16/24 | (2006.01) | |
| G11C 16/08 | (2006.01) | |

(52) U.S. Cl.
CPC  *G11C 5/02* (2013.01); *G11C 5/025* (2013.01); *G11C 7/18* (2013.01); *G11C 8/12* (2013.01); *G11C 16/00* (2013.01); *G11C 16/24* (2013.01); *G11C 16/08* (2013.01)

(58) Field of Classification Search
USPC .............................................. 365/190, 51, 63
See application file for complete search history.

(56) References Cited

U.S. PATENT DOCUMENTS

| | | | | |
|---|---|---|---|---|
| 5,237,534 | A  * | 8/1993 | Tanaka et al. ............. | 365/185.21 |
| 5,661,678 | A  * | 8/1997 | Yoshida et al. ............... | 365/149 |
| 5,910,911 | A  * | 6/1999 | Sekiguchi et al. ............ | 365/145 |
| 5,936,276 | A | 8/1999 | Maurelli et al. | |
| 6,355,523 | B1 | 3/2002 | Maurelli et al. | |
| 6,449,204 | B1 * | 9/2002 | Arimoto et al. ............... | 365/222 |
| 6,597,599 | B2 * | 7/2003 | Morihara et al. ............. | 365/149 |
| 6,680,861 | B2 * | 1/2004 | Kasai ............................ | 365/145 |
| 6,850,449 | B2 * | 2/2005 | Takahashi ..................... | 365/222 |
| 6,925,021 | B2 * | 8/2005 | Cowles et al. ................ | 365/222 |
| 6,961,271 | B2 * | 11/2005 | Jeon et al. ..................... | 365/190 |

(Continued)

OTHER PUBLICATIONS

Search Report for Italian patent application No. TO20120682; Munich, Germany, Oct. 23, 2012, 2 pages.

*Primary Examiner* — Son Mai
(74) *Attorney, Agent, or Firm* — Gardere Wynne Sewell LLP

(57) ABSTRACT

An embodiment of a non-volatile memory device includes: a memory array, having a plurality of non-volatile logic memory cells arranged in at least one logic row, the logic row including a first row and a second row sharing a common control line; and a plurality of bit lines. Each logic memory cell has a direct memory cell, for storing a logic value, and a complementary memory cell, for storing a second logic value, which is complementary to the first logic value in the corresponding direct memory cell. The direct memory cell and the complementary memory cell of each logic memory cell are coupled to respective separate bit lines and are placed one in the first row and the other in the second row of the respective logic row.

20 Claims, 5 Drawing Sheets

(56) References Cited

U.S. PATENT DOCUMENTS

| | | | |
|---|---|---|---|
| 7,375,999 B2* | 5/2008 | Vogelsang | 365/149 |
| 7,402,855 B2* | 7/2008 | Kurjanowicz | 257/288 |
| 2003/0063501 A1 | 4/2003 | Covarel et al. | |
| 2004/0047172 A1* | 3/2004 | Komatsuzaki | 365/145 |
| 2004/0061168 A1 | 4/2004 | Cappelletti et al. | |
| 2005/0041514 A1* | 2/2005 | Fujino et al. | 365/230.08 |
| 2006/0028900 A1 | 2/2006 | Shin et al. | |
| 2011/0157977 A1 | 6/2011 | Pasotti et al. | |
| 2012/0036315 A1* | 2/2012 | Reohr et al. | 711/105 |
| 2014/0016390 A1* | 1/2014 | Zhao et al. | 365/63 |

* cited by examiner

NON-VOLATILE MEMORY DEVICE WITH CLUSTERED MEMORY CELLS

PRIORITY CLAIM

The instant application claims priority to Italian Patent Application No. TO2012A000682, filed Jul. 31, 2012, which application is incorporated herein by reference in its entirety.

TECHNICAL FIELD

An embodiment relates to a non-volatile memory device with clustered memory cells.

SUMMARY

As is known, some integrated electronic devices require a certain amount of non-volatile memory. As a rule, non-volatile memory is available in stand-alone memory boards or cards, separate from chips in which control and processing functions of the devices are integrated. In several cases, however, processing units need to be provided with embedded non-volatile memory, integrated in the same chip.

In conventional stand-alone non-volatile memory devices, the structure of the memory cells cannot be easily integrated in CMOS manufacturing processes, which are widely exploited to make processing and control components. In particular, floating gate cells normally require one additional polysilicon level relative to standard CMOS process flows. Thus, integration of non-volatile memory cells in standard CMOS processes would require additional processing steps and masks, which represent an increase of cost for the typically quite small amount of integrated non-volatile memory that is often required.

Therefore, non-volatile memory cells with different architectures have been designed, in which the floating gates of memory cells and the gate regions of all the other integrated MOS transistors are made from a single polysilicon layer.

In this manner, additional process steps and masks are avoided, and integration in CMOS process flow is much easier.

Cost-effective non-volatile memory cells may exploit select MOS transistors for capacitively coupling a storage floating gate with control regions for read and erasure operations, while a bipolar transistor may be used for program operations by injection of hot electrons; erasure is typically based on the Fowler-Nordheim effect. Memory cells of this kind favour programming speed at the expense of power consumption and occupation of area. Moreover, the maximum number of program/erase cycles is far lower for such cost-effective cells than for cells of stand-alone memories.

Fowler-Nordheim memory cells exploit homonymous effect for both programming and erasure and are often preferred to cost-effective cells because a greater number of program/erase cycles is generally available and power consumption is generally lower.

Examples of cost-effective and Fowler-Nordheim non-volatile memory cells are described in US Patent Application Publication n. US 2011/0157977 A1, which is incorporated by reference.

For the purpose of reducing errors and improving reliability, non-volatile memory arrays may use two complementary cells to store one bit. One cell (direct cell) of each pair of complementary cells stores a logic value, whereas the complemented logic value is stored in the other cell (complementary cell) of the same pair of cells. Hence, a pair of physical complementary cells form one logic cell, in which one bit is stored. Complementary cells are differentially read, in order to increase signal amplitude and avoid errors.

In addition, several bias electrical-coupling lines are used to provide appropriate voltages to each cell terminal in an array for program, erase, and read operations. The need for such lines leads to specific array designs. In the example of FIG. 1, two adjacent rows 1a, 1b share a control gate structure 2 and accommodate clusters 3 of two logic cells 5 each (i.e., two pairs of complementary physical cells). Logic cells 5 in the same cluster 3 have adjacent column addresses. For example, logic cell 5 having lower column address K is arranged in row 1a; and logic cell 5 having higher column address K+1 is arranged in row 1b. Moreover, direct memory cells 5a of the two logic cells 5 are aligned in a first array column; and complementary memory cells 5b of the two logic cells 5 are aligned in a second array column, adjacent to the first array column. Direct memory cells 5a are served by a first bit line KM and by a first set of bit control lines, here referenced by BKd, BNKd, BK−1d, BNK+1d; and complementary memory cells 5b are served by a second bit line BLJc and by a second set of bit control lines, here referenced by BKc, BNKc, BK+1c, BNK+1c.

Usually, a set of bit select lines includes four bit select lines. Thus, column addressing requires, for each cluster, two bit lines (KM, BLJc) and as many bit select lines as twice the bit select lines in each set. Consequently, in the example of FIG. 1, ten coupling lines are necessary to address two logic cells.

Therefore, cell pitch is likely to be determined more by the need of coupling lines for column addressing than by the structure of the physical cells themselves.

Therefore, an embodiment includes a non-volatile memory device that allows avoiding, or at least attenuating, the limitations of known non-volatile memories and, in particular, allows reducing area requirements.

BRIEF DESCRIPTION OF THE DRAWINGS

For a better understanding of the concepts disclosed herein, an embodiment will be now described, purely by way of non-limiting example and with reference to the following attached drawings.

DETAILED DESCRIPTION

Figure 1:
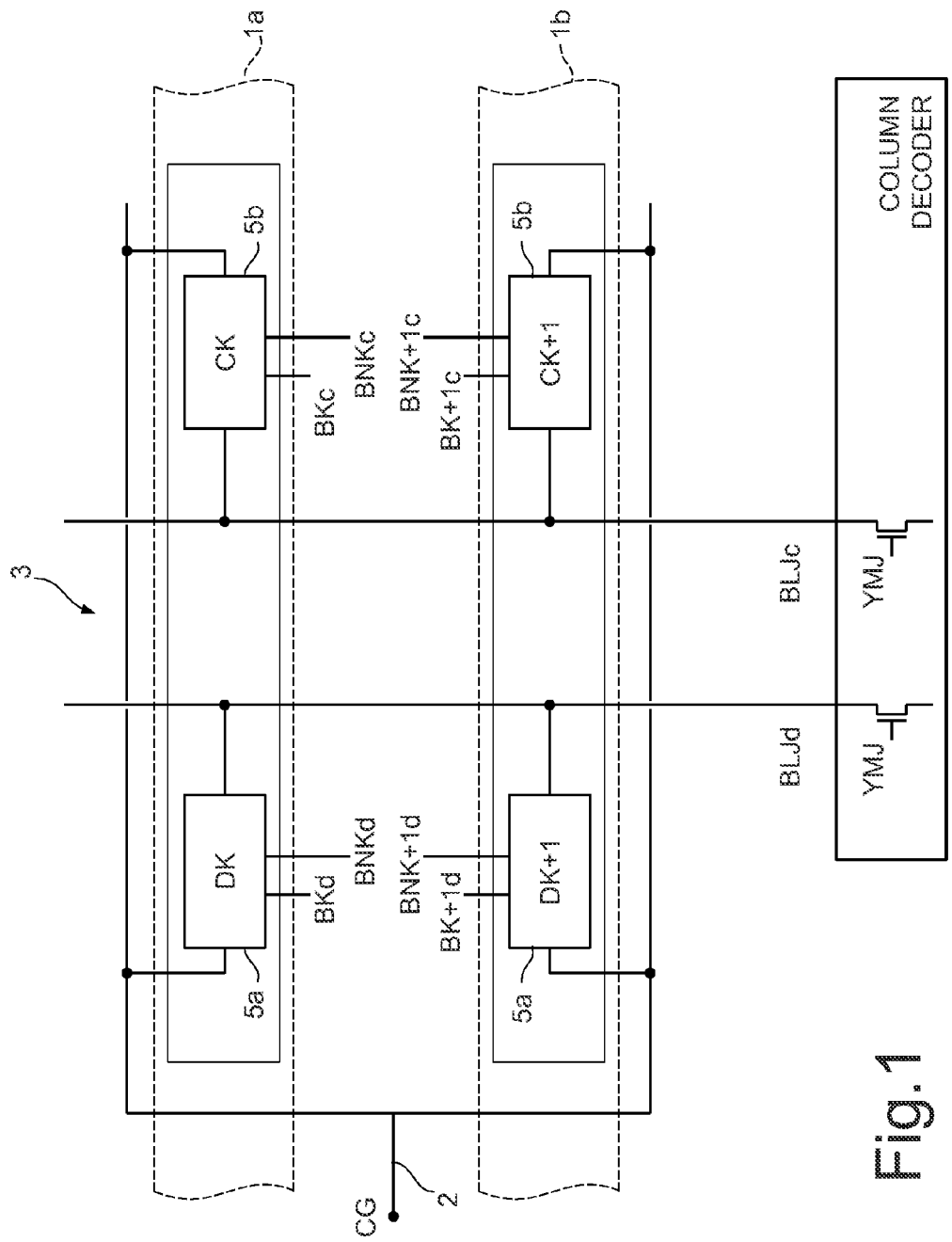
FIG. 1 is a simplified block diagram of a portion of a known non-volatile memory array.
Figure 2:
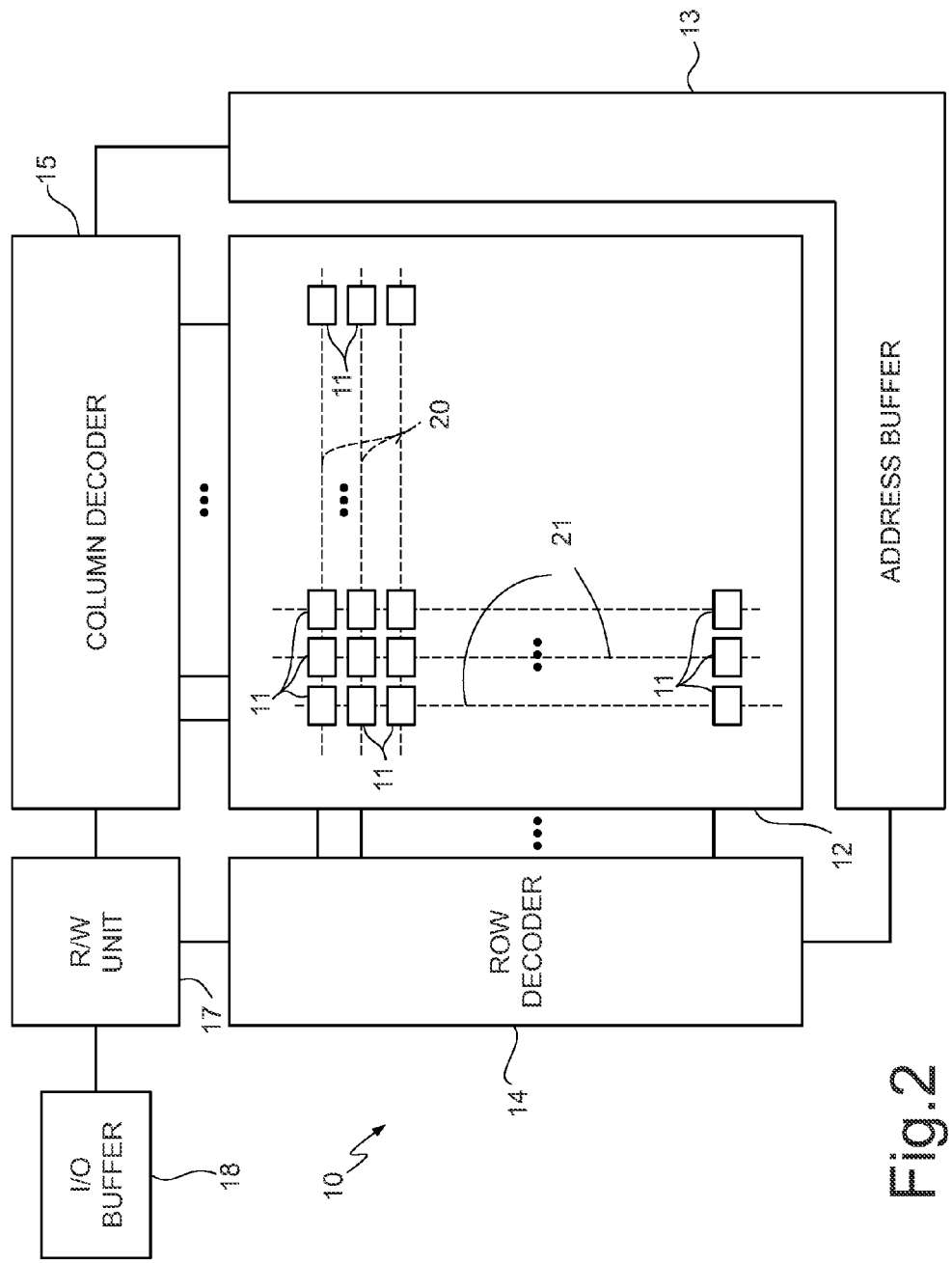
FIG. 2 is a simplified block diagram of a non-volatile memory device, according to an embodiment.

With reference to FIG. 2, a differential non-volatile memory device is designated by reference number 10 and includes a plurality of non-volatile logic memory cells 11 organized in logic rows 20 and logic columns 21 to form an array 12 (e.g., 128-512 rows and 512-1024 columns).

The memory device 10 further includes an address buffer 13, a row decoder 14, a column decoder 15, a read/write unit 17, and an input/output buffer 18 (hereinafter, the terms "write" and "writing" will be used to indicate indifferently program and read operations of the logic memory cells 11).

The address buffer 13 receives addresses of cells selected from a page of the array 12. Row and column sections of the address are provided to the row decoder 14 and to the column decoder 15, which select corresponding row(s) and column(s) of the array 12.

The read/write unit 17 controls the row decoder 14 and the column decoder 15 and is provided with components required for program, erase, and read operations of memory cells (including, e.g., a power supply management unit, charge pumps, read amplifiers, comparators, reference cells, and signal generators). The read/write unit 17 is coupled to the input/output buffer 18 for receiving data words (or other measures of data) to be stored in the array 12 and to supply to the outside data words (or other measures of data) read from the array 12.

Figure 3:
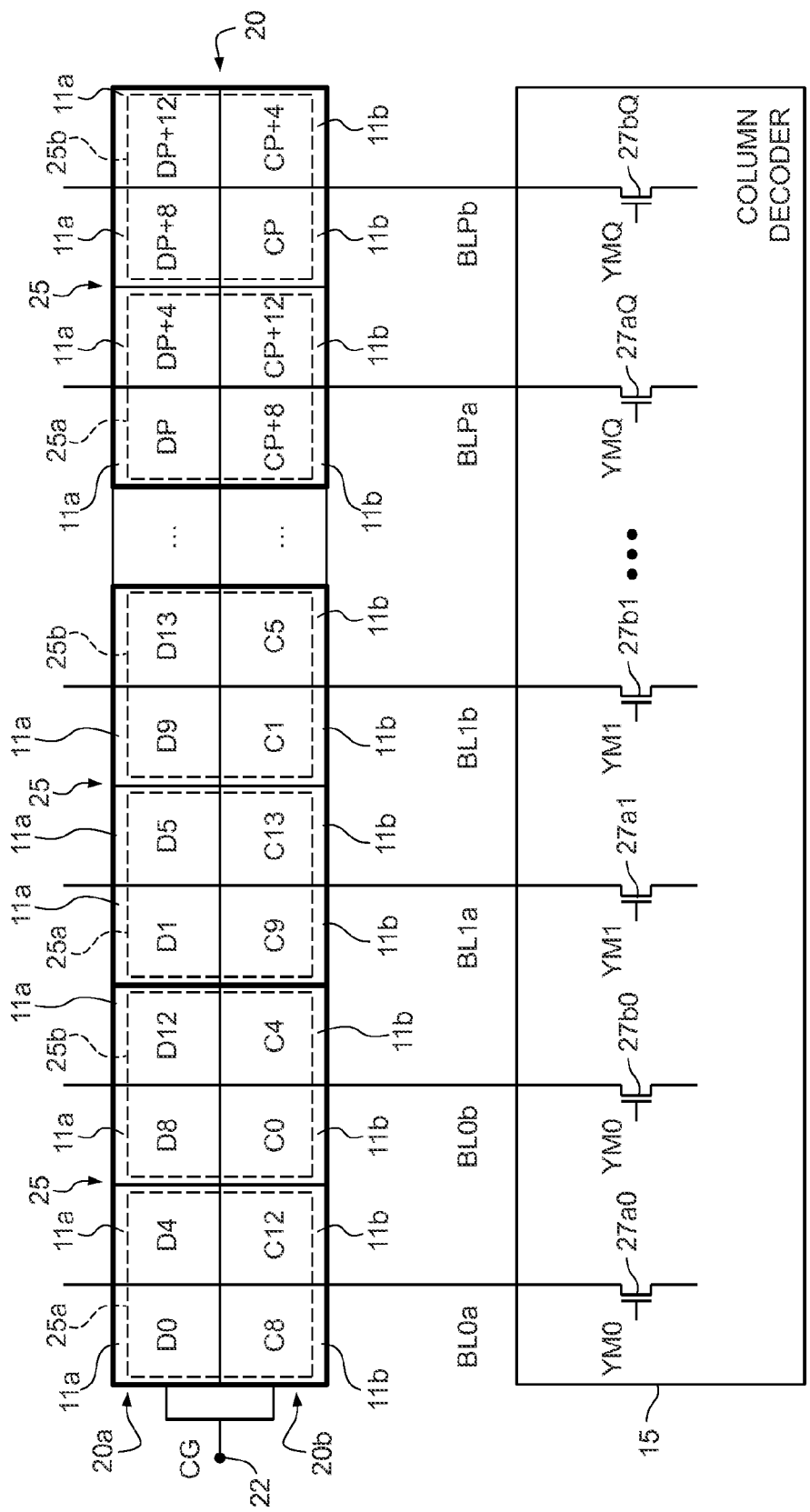
FIG. 3 is a block diagram of a row of a non-volatile memory array incorporated in the non-volatile memory device of FIG. 2, according to an embodiment.

FIG. 3 shows an exemplary logic row 20 of the memory array 12, coupled to the column decoder 15. Each logic row 20 includes a first row 20a and a second row 20b, which run adjacent to one another and share a common control gate line 22.

Figure 4:
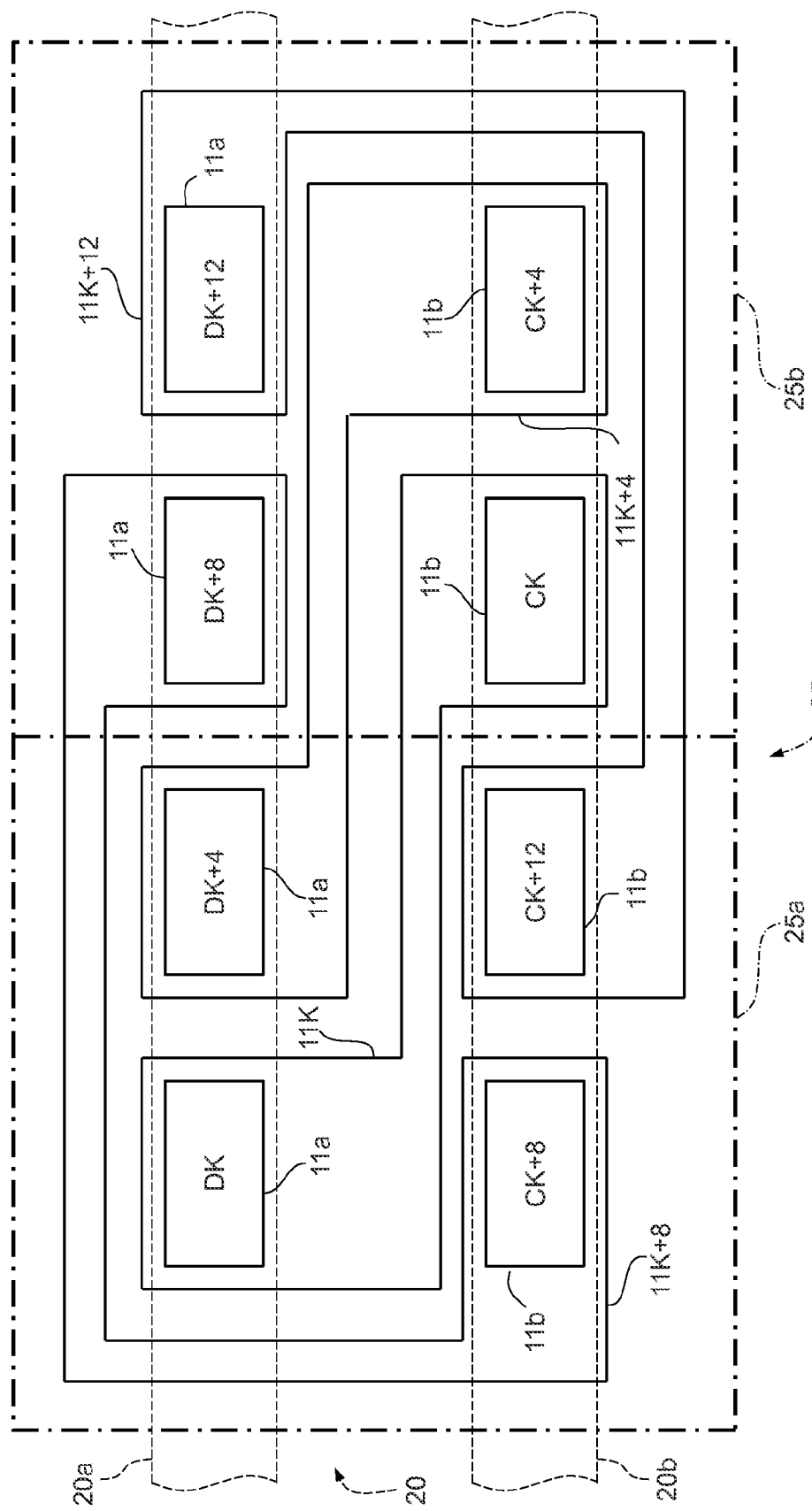
FIG. 4 is a more detailed block diagram of a cluster of memory cells in the row of the non-volatile memory array of FIG. 3, according to an embodiment.

As illustrated in FIG. 4, each logic memory cell 11 (see in particular FIG. 3) includes one respective (physical) direct memory cell 11a and one (physical) complementary memory cell 11b. In an embodiment, logic memory cells 11 which belong to the same logic row 20 have their direct memory cells 11a and complementary memory cells 11b respectively aligned in the first row 20a and in the second row 20b of the logic row 20 (see also FIGS. 3 and 5).

Direct memory cells 11a and complementary memory cells 11b are based on single-polysilicon-layer floating gate MOS transistors, a threshold voltage of which is determined by the amount of charge stored in the respective floating gate. For example, the direct memory cells 11a and complementary memory cells 11b may have the structure of the Fowler-Nordheim cells described in US Patent Application Publication No. US 2011/0157977 A1, which is incorporated by reference. It is, however, understood that other cell structures are available and may be advantageously exploited.

Each direct memory cell 11a and each complementary memory cell 11b is capable of storing $2^N$ charge levels, indicative of N bits of information. In the following description, reference will be made to the case in which each memory cell 11a, 11b can store 2 charge levels and 1 bit. It is, however, understood that the example disclosed is not to be considered as limitative.

A first logic value (e.g., "0") is understood to be stored in a direct memory cell 11a or in a complementary memory cell 11b when the direct memory cell 11a or complementary memory cell 11b is programmed to have a first (high) threshold value; and a second logic value (e.g., "1") is understood to be stored in a direct memory cell 11a or in a complementary memory cell 11b when the direct memory cell 11a or complementary memory cell 11b is programmed to have a second (low) threshold value.

In each logic memory cell 11, the respective direct memory cell 11a stores one of the first logic value and second logic value and the respective complementary memory cell 11b stores the other (complement) of the first logic value and second logic value. Therefore, a direct memory cell 11a and a complementary memory cell 11b which belong to the same logic memory cell 11 always store complementary logic values in normal operation. Differential reading of the logic memory cell 11 is, therefore, available.

In an embodiment, logic memory cells 11 can be individually addressed for program, erase, and read operations.

Figure 5:
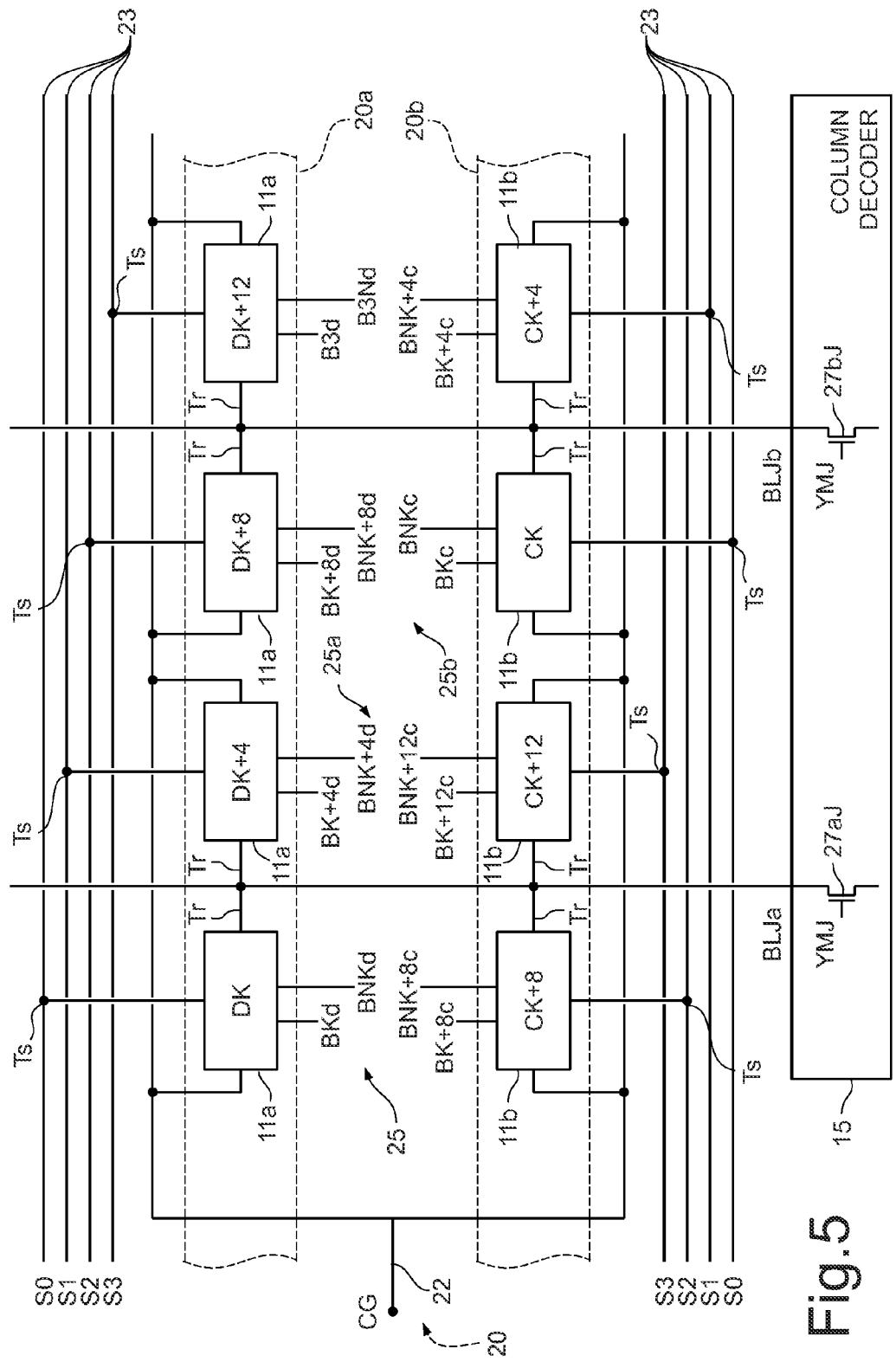
FIG. 5 is a hybrid block and electrical diagram of the cluster of memory cells of FIG. 4, according to an embodiment.

Logic memory cells 11 of the same logic row 20 are organized in clusters 25 of M cells each (four in the embodiment described herein; it is however understood that each cluster 25 could include different numbers of logic memory cells 11, e.g., a power of two other than four). In an embodiment, logic memory cells 11 in the same cluster 25 are identified by address columns separated from one another by homogeneous intervals of M (four, in this embodiment). Logic memory cells of the cluster 25 shown in FIGS. 4 and 5 are referenced by symbols 11K, 11K+4, 11K+8, 11K+12, respectively. Moreover, in FIGS. 3 and 4, direct memory cells 11a of the four logic memory cells 11K, 11K+4, 11K+8, 11K+12 in the cluster 25 are further referenced by symbols DK, DK+4, DK+8, DK+12, respectively; and the corresponding complementary memory cells 11b are further referenced by symbols CK, CK+4, CK+8, CK+12, respectively.

Each cluster 25 includes a first sub-cluster 25a and a second sub-cluster 25b.

As illustrated in FIGS. 3-5, logic memory cells 11 of the same cluster 25 are arranged so that each logic memory cell 11 has the respective direct memory cell 11a and complementary memory cell 11b, one in the first sub-cluster 25a and the other in the second sub-cluster 25b. In an embodiment, logic memory cells 11K, 11K+4 have their direct memory cell 11a in the first sub-cluster 25a and their complementary memory cell 11b in the second sub-cluster 25b; and logic memory cells 11K+8, 11K+12 have their direct memory cell 11a in the second sub-cluster 25b and their complementary memory cell 11b in the first sub-cluster 25a.

Therefore, each logic memory cell 11 in the array 12 has its direct memory cell 11a and its complementary memory cell 11b respectively in the first row 20a and second row 20b of the logic row 20 to which the logic memory cell 11 belongs. Moreover, each logic memory cell 11 in the array 12 has its direct memory cell 11a and its complementary memory cell 11b one in the first sub-cluster 25a and the other in the second sub-cluster 25b of the cluster 25 to which the logic memory cell 11 belongs.

With reference to FIG. 5, logic memory cells 11 of the same cluster 25 have read terminals Tr coupled to a first bit line BLJa and to a second bit line BLJb, which also serve logic memory cells 11 of clusters 25 in the same column. More precisely, read terminals Tr of logic memory cells 11 in the first sub-cluster 25a are coupled to the first bit line BLJa; and read terminals Tr of logic memory cells 11 in the second sub-cluster 25b are coupled to the second bit line BLJb.

As shown in FIGS. 3 and 5, the first bit line BLJa and the second bit line BLJb pertaining to the first sub-cluster 25a and the second sub-cluster 25b of the same cluster 25 are simultaneously addressed by the column decoder 15 through separate switch systems 27aJ, 27bJ (schematically illustrated by single transistors) which receive the same set of address signals YMJ. Thus, each cluster 25 of four logic memory cells 11 requires two bit lines, which are simultaneously selected or deselected by the column decoder 15. In general, the number of bit lines required for each cluster is M/2, if M is the number of logic cells per cluster. More precisely, each cluster 25 requires M/4 first bit lines and M/4 second bit lines.

FIGS. 3 and 5 show that each logic memory cell 11 at generic column address K is also coupled to direct first bit control lines BKd, BNKd (for the respective direct memory cell 11a) and to complementary second bit control lines BKc, BNKc (for the respective complementary memory cell 11b).

Direct memory cells 11a and complementary memory cells 11b in the same first row 20a or second row 20b of a logic row 20 are selectable by the row decoder 14 for program, erase, and read operations through the respective control gate line 22 and through sets of M select gate lines 23 (one set for the first row 20*a* and one set for the second row 20*b* of each logic row 20; FIG. 5). In the embodiment herein described, each set includes four select gate lines 23.

Direct memory cells 11*a* and complementary memory cells 11*b* have select gate terminals Ts coupled each to a respective select gate line 23. More precisely, select gate terminals Ts of direct memory cells 11*a* in the same cluster 25 are coupled to respective distinct select gate lines 23 of the set of select gate lines 23 associated with the respective first row 20*a*. Likewise, select terminals gate Ts of complementary memory cells 11*b* in the same cluster 25 are coupled to respective distinct select gate lines 23 of the set of select gate lines 23 associated with the respective second row 20*b*.

Moreover, the direct memory cell 11*a* and the complementary memory cell 11*b* of each logic memory cell 11 are coupled to corresponding select gate lines 23 of the sets of select gate lines 23 associated with the respective first row 20*a* and second row 20*b*. Select signals S0, S1, S2, S3 are provided by the row decoder 14 over respective select gate lines 23 of each set. In each logic row 20, select signals S0, S1, S2, S3 for the first row 20*a* are the same as select signals S0, S1, S2, S3 for the second row 20*b*. Therefore, logic memory cells 11 are coupled to respective select gate lines 23 so that the respective direct memory cell 11*a* and complementary memory cell 11*b* receive at their select gate terminals Ts the same select signal S0, S1, S2, S3.

As already mentioned, the above-described non-volatile memory array requires M/2 bit lines for each cluster of M logic memory cells (two bit lines for each cluster of four logic memory cells in the embodiment described). In contrast, known single-polysilicon-layer memory arrays require two bit lines for each pair of logic memory cells. The overall number of bit lines is significantly reduced and constraints on cell pitch caused by requirements for column address are loosened.

Due to the coupling to bit lines, the memory array is conveniently structured to allow checkerboard-programming direct and complementary memory cells. This feature enables effective factory testing of the memory array, e.g., during EWS ("Electrical Wafer Sorting").

An embodiment of the memory 10 including the cell clusters 25 may be disposed on a first integrated circuit, which may be part of a system (e.g., a smart phone) in which the first integrated circuit is coupled to at least one second integrated circuit. One of the first and second integrated circuits may be a computing circuit such as a microprocessor or microcontroller. Furthermore, the first and second integrated circuits may be disposed on separate or respective dies.

Furthermore, embodiments of architectures other than those described above may also allow a reduced number of bit lines, such as M/2 bit lines for each cluster of M logic memory cells (e.g., two bit lines for each cluster of four logic memory cells). For example, referring to FIG. 5, one may swap the locations of the complementary cells CK and CK+4 with the locations of the direct cells DK+8 and DK+12, respectively.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An integrated circuit, comprising:
   first and second rows;
   first and second data lines;
   a control gate line;
   a portion of a memory cell disposed in one of the first and second rows and coupled to one of the first and second data lines and to the control gate line; and
   a complementary portion of the memory cell disposed in the other of the first and second rows and coupled to the other of the first and second data lines and to said control gate line.

2. The integrated circuit of claim 1 wherein the first and second data lines include first and second bit lines.

3. The integrated circuit of claim 1 wherein the portion and complementary portion of the memory cell each include a non-volatile memory cell with a control gate terminal coupled to said control gate line.

4. The integrated circuit of claim 1 wherein the memory cell includes a differential memory cell.

5. The integrated circuit of claim 1, further comprising a select line coupled to the portion and the complementary portion of the memory cell.

6. The integrated circuit of claim 1, further comprising:
   a cluster of more than two memory cells each having a respective portion coupled to one of the first and second data lines and having a respective complementary portion coupled to the other of the first and second data lines; and
   wherein the memory cell is disposed in the cluster.

7. The integrated circuit of claim 1, further comprising:
   a cluster of more than two memory cells each having a respective portion disposed in one of the first and second rows and coupled to one of the first and second data lines and having a respective complementary portion disposed on the other of the first and second rows and coupled to the other of the first and second data lines; and
   wherein the memory cell is disposed in the cluster.

8. An integrated circuit, comprising:
   a control gate line;
   first and second data lines; and
   at least three memory cells each disposed in at least two rows, each having a first portion configured to store data, the first portion having a first transistor including a conduction terminal coupled to one of the first and second data lines and a gate terminal coupled to the control gate line, and each having a second portion configured to store a complement to the data, the second portion having a second transistor including a conduction terminal coupled to the other of the first and second data lines and a control terminal coupled to said control gate line.

9. The integrated circuit of claim 8 wherein: the first portions of the memory cells are coupled to the same one of the first and second data lines; and the second portions of the memory cells are coupled to the same other one of the first and second data lines.

10. The integrated circuit of claim 8, further comprising: first and second rows; wherein the respective first portion of each memory cell is disposed in one of the first and second rows; and wherein the respective section portion of each memory cell is disposed in the other of the first and second rows.

11. The integrated circuit of claim 8, further comprising: first and second rows; wherein the respective first portion of each memory cell is disposed in a same one of the first and second rows; and wherein the respective section portion of each memory cell is disposed in a other of the first and second rows.

12. A system, comprising:
   a first integrated circuit, including:
      a control gate line, first and second rows, first and second data lines, a portion of a memory cell disposed in one of the first and second rows and comprising a transistor having a conduction terminal coupled to one of the first and second data lines and a control terminal coupled to the control gate line, and a complementary portion of the memory cell disposed in the other of the first and second rows and coupled to the other of the first and second data lines and to said control gate line; and a second integrated circuit coupled to the first integrated circuit.

13. A system, comprising:

a first integrated circuit, including a control gate line, first and second data lines, and at least three memory cells each disposed in at least two rows, each having a first portion configured to store data, the first portion coupled to one of the first and second data lines and to the control gate line, and each having a second portion configured to store a complement to the data, the second portion coupled to the other of the first and second data lines and to the control gate line; and a second integrated circuit coupled to the first integrated circuit.

14. The system of claim 13 wherein one of the first and second integrated circuit includes a computing circuit.

15. The system of claim 13 wherein the first and second integrated circuits are disposed on a same die.

16. The system of claim 13 wherein the first and second integrated circuits are disposed on respective dies.

17. A method, comprising:

accessing a portion of a memory cell, the portion disposed in a row and coupled to a control gate line; and accessing another portion of the memory cell, the other portion disposed in another row and coupled to said control gate line.

18. The method of claim 17 wherein:

accessing the portion includes writing a data value to the portion; and accessing the other portion includes writing a complementary data value to the other portion.

19. The method of claim 17 wherein:

accessing the portion includes reading a data value from the portion; and accessing the other portion includes reading a complementary data value from the other portion.

20. The method of claim 17 wherein:

accessing the portion includes coupling an access signal to the portion; and accessing the other portion includes coupling the access signal to the other portion.

* * * * *